United States Patent
Suga

(10) Patent No.: US 7,217,631 B2
(45) Date of Patent: May 15, 2007

(54) SEMICONDUCTOR DEVICE AND METHOD FOR FABRICATING THE DEVICE

(75) Inventor: Tadatomo Suga, 2-2-2-207, Komaba, Meguro-ku, Tokyo 153-0041 (JP)

(73) Assignees: Tadatomo Suga, Tokyo (JP); Sharp Kabushiki Kaisha, Osaka (JP); Oki Electric Industry Co., Ltd., Tokyo (JP); Sanyo Electric Co., Ltd, Osaka (JP); Sony Corporation, Tokyo (JP); Kabushiki Kaisha Toshiba, Kanagawa (JP); NEC Corporation, Tokyo (JP); Renesas Technology Corp., Tokyo (JP); Fujitsu Limited, Kanagawa (JP); Matsushita Electric Industrial Co., Ltd, Osaka (JP); Rohm Co., Ltd., Kyoto (JP)

( * ) Notice: Subject to any disclaimer, the term of this patent is extended or adjusted under 35 U.S.C. 154(b) by 242 days.

(21) Appl. No.: 11/077,212

(22) Filed: Mar. 11, 2005

(65) Prior Publication Data

US 2005/0170626 A1 Aug. 4, 2005

Related U.S. Application Data

(62) Division of application No. 09/898,082, filed on Jul. 5, 2001, now Pat. No. 7,078,811.

(30) Foreign Application Priority Data

Jul. 5, 2000 (JP) .............................. 2000-203871

(51) Int. Cl.
*H01L 21/76* (2006.01)
*H01L 21/302* (2006.01)

(52) U.S. Cl. ...................... 438/406; 438/637; 438/670; 438/674; 438/675; 438/697; 438/735; 438/737; 438/738

(58) Field of Classification Search ...................... None
See application file for complete search history.

(56) References Cited

U.S. PATENT DOCUMENTS 4,612,083 A 9/1986 Yasumoto et al.

(Continued)

FOREIGN PATENT DOCUMENTS

| EP | 0 700 088 | 3/1996 |
|---|---|---|
| JP | 11-284066 | 10/1999 |
| WO | WO 89/03122 | 4/1989 |

OTHER PUBLICATIONS

U.S. Appl. No. 09/898,082, filed Jul. 5, 2001.
U.S. Appl. No. 09/548,916, filed Apr. 13, 2000 entitled "Semiconductor Device and Manufacturing Method Thereof".
German Office Action dated Dec. 15, 2005 (w/English translation thereof).

*Primary Examiner*—Jasmine Clark
(74) *Attorney, Agent, or Firm*—Nixon & Vanderhye P.C.

(57) ABSTRACT

There are provided a semiconductor device and method for fabricating the device capable of achieving reliable electrical connection by securely directly bonding conductors to each other even though bonding surfaces are polished by a CMP method and solid-state-bonded to each other. By polishing according to the CMP method, a through hole conductor 5 and a grounding wiring layer 10, which are made of copper, become concave in a dish-like shape and lowered in level, causing a dishing portion 17 since they have a hardness lower than that of a through hole insulator 11 made of silicon nitride. The through hole insulator 11 is selectively etched by a reactive ion etching method until the through hole insulator 11 comes to have a height equal to the height of a bottom portion 19 of the dishing portion 17 of the through hole conductor 5. The through hole conductors 5 and 25 are aligned with each other, and the bonding surfaces 12 and 22 are bonded to each other in a solid state bonding manner.

18 Claims, 8 Drawing Sheets

U.S. PATENT DOCUMENTS

| | | |
|---|---|---|
| 4,939,568 A | 7/1990 | Kato et al. |
| 5,939,789 A | 8/1999 | Kawai et al. |
| 5,985,748 A * | 11/1999 | Watts et al. ............ 438/622 |
| 5,986,339 A | 11/1999 | Pai et al. |
| 6,080,640 A | 6/2000 | Gardner et al. |
| 6,171,949 B1 * | 1/2001 | You et al. ............ 438/633 |
| 6,251,772 B1 * | 6/2001 | Brown ............ 438/626 |
| 6,255,217 B1 * | 7/2001 | Agnello et al. ............ 438/687 |
| 6,281,576 B1 | 8/2001 | Hakey et al. |
| 6,541,372 B2 * | 4/2003 | Wege et al. ............ 438/633 |

* cited by examiner

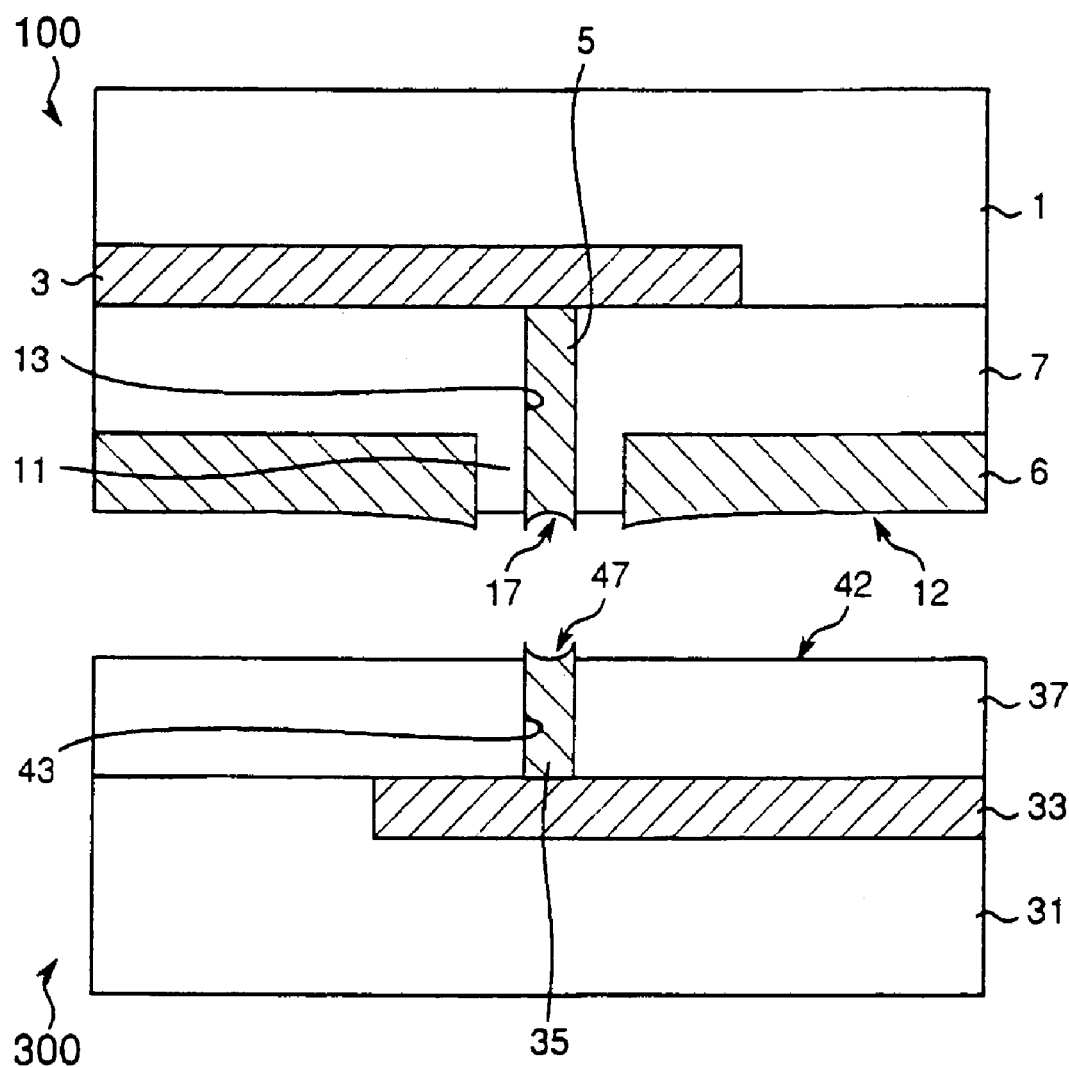

SEMICONDUCTOR DEVICE AND METHOD FOR FABRICATING THE DEVICE

This application is a Divisional of application Ser. No. 09/898,082, filed Jul. 5, 2001, now U.S. Pat. No. 7,078,811 the entire content of which is incorporated herein by reference in this application.

BACKGROUND OF THE INVENTION

The present invention relates to a semiconductor device that has a plurality of substrates and a method for fabricating the device.

Lately, the present inventor has proposed this kind of semiconductor device obtained by laminating a conductive layer and an insulating layer on a first semiconductor substrate, polishing its surface by chemical mechanical polishing (hereinafter abbreviated to CMP) for the formation of a flat first bonding surface on which a silicon nitride film that serves as an insulating layer and copper that is a through hole conductor for plugging a through hole of the silicon nitride film are exposed, laminating a conductive layer and an insulating layer on a second semiconductor substrate, subjecting its surface to CMP for the formation of a flat second bonding surface on which a silicon nitride film and copper that is a through hole conductor are exposed, further applying pressure welding loads to the first semiconductor substrate and the second semiconductor substrate for the achievement of the solid state bonding of the first bonding surface to the second bonding surface and electrically connecting the through hole conductors to each other. It is to be noted that this semiconductor device is mentioned for the sake of explaining the present invention, and this means that the device has not yet been made public and is not the prior art.

This semiconductor device has the advantages that it can simply prevent electromagnetic radiation noises because of the provision of the conductive layer on the first and second substrates and that the interconnections can be made short and easy because the through hole conductors are bonded together in the solid state bonding manner.

However, the aforementioned semiconductor device, in which the through hole conductors that are made of copper and provided inside the through holes of the silicon nitride films have a hardness lower than that of the silicon nitride films that are the insulating layers. Therefore, when the first bonding surface and the second bonding surface are subjected to CMP, then dishing (a dish-shaped hollow) occurs on the surface of the through hole conductors, and this possibly leads to a fail in directly bonding the through hole conductors to each other. That is, the electrical connection of the through hole conductors has no reliability.

SUMMARY OF THE INVENTION

Accordingly, the object of the present invention is to provide a semiconductor device and a method for fabricating the device capable of achieving reliable electrical connection by securely directly bonding conductors to each other even though their bonding surfaces are subjected to CMP and solid state bonding.

In order to achieve the aforementioned object, the present invention provides a semiconductor device comprising:

a first portion having a first substrate, a conductive layer and an insulating layer laminated on the first substrate and a bonding surface that is chemically mechanically polished and exposes a conductive region and an insulating region;

a second portion having a second substrate, a conductive layer and an insulating layer laminated on the second substrate and a bonding surface that is chemically mechanically polished and exposes at least a conductive region; and wherein the bonding surface of the first portion and the bonding surface of the second portion are solid-state-bonded to each other and at least one of the bonding surface of the first portion and the bonding surface of the second portion has the insulating region lowered with respect to the conductive region.

In the semiconductor device of the aforementioned construction, the bonding surfaces of the first and second portions are chemically mechanically polished, and therefore, dishing portions occur in the conductive regions adjacent to the insulating regions. However, the insulating region is lowered with respect to the conductive region on at least one of the bonding surface of the first portion and the bonding surface of the second portion, and therefore, the conductive region is protruding. Accordingly, the conductive regions are securely directly bonded to each other even though the dishing portions exist. Therefore, a high-reliability electrical connection of the conductive regions can be obtained.

In one embodiment, dishing portions of the conductive regions are bonded to each other.

In one embodiment, the conductive region of the first portion and the conductive region of the second portion are solid-state-bonded to each other, and the insulating region of the first portion and the insulating region of the second portion face each other with interposition of a clearance.

In one embodiment, the insulating region that surrounds the conductive region of the first portion and the insulating region that surrounds the conductive region of the second portion face each other with interposition of a clearance.

In one embodiment, the conductive region of the first portion and the conductive region of the second portion are solid-state-bonded to each other, and the insulating region of the first portion and the insulating region of the second portion are put in contact with or solid-state-bonded to each other.

In one embodiment, the insulating region that surrounds the conductive region of the first portion and the insulating region that surrounds the conductive region of the second portion are put in contact with or solid-state-bonded to each other.

In one embodiment, the conductive regions are end surfaces of through hole conductors and the insulating regions are end surfaces of through hole insulators that surround the respective through hole conductors.

In one embodiment, the first substrate or the second substrate is any one of a semiconductor substrate, an inorganic substrate and an organic substrate.

According to the present invention, there is provided a semiconductor device fabricating method comprising the steps of:

forming a first portion having a first substrate, a conductive layer and an insulating layer laminated on the first substrate and a bonding surface that is chemically mechanically polished and exposes a conductive region and an insulating region;

forming a second portion having a second substrate, a conductive layer and an insulating layer laminated on the second substrate and a bonding surface that is chemically mechanically polished and exposes at least a conductive region;

selectively etching the insulating region of at least one of the bonding surface of the first portion and the bonding surface of the second portion, thereby lowering the surface of the insulating region with respect to the surface of the conductive region; and applying pressure welding loads to the first portion and the second portion for achievement of solid state bonding of the bonding surface of the first portion to the bonding surface of the second portion and for achievement of electrical connection of the conductive region of the first portion with the conductive region of the second portion.

According to the semiconductor device fabricating method of the above construction, the bonding surfaces of the first and second portions are chemically mechanically polished, and therefore, dishing portions occur in the conductive regions adjacent to the insulating regions. However, the surface of the insulating region is lowered with respect to the surface of the conductive region by selectively etching the insulating region on at least one of the bonding surface of the first portion and the bonding surface of the second portion, and therefore, the surface of the conductive region is protruding from the surface of the insulating region. Accordingly, the conductive regions are securely directly bonded to each other even though the dishing portions exist in the conductive regions. Therefore, a high-reliability electrical connection of the conductive regions can be obtained.

In one embodiment, the surface of the insulating region is lowered by reactive ion etching.

In one embodiment, etching is performed so that a height of a bottom of a dishing portion of the conductive region and a height of the insulating region become approximately equal to each other.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a view for explaining a state immediately before the execution of the solid state bonding of the second embodiment.

DETAILED DESCRIPTION OF THE PREFERRED EMBODIMENTS

Figure 1A:
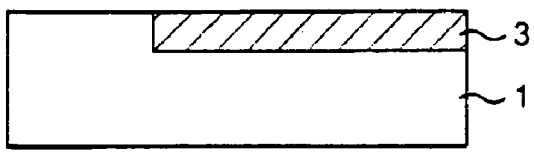
FIGS. 1A, 1B, 1C, 1D and 1E are views for explaining a semiconductor device fabricating method according to a first embodiment of the present invention.

The present invention will be described in detail below on the basis of the embodiments shown in the drawings.

Figure 1B:
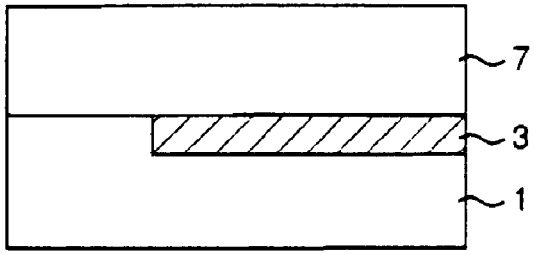

FIGS. 1A through 1E, 2A through 2C, 3 and 4 show a semiconductor device fabricating method of the first embodiment. First, as shown in FIG. 1A, a wiring layer 3 is provided as an example of a conductive layer on a semiconductor substrate 1 that serves as an example of a first substrate. Further, as shown in FIG. 1B, an insulating layer 7 is laminated on the semiconductor substrate 1 and the wiring layer 3. The wiring layer 3 is made of a metal of, for example, copper, an aluminum alloy or the like, a polysilicon doped with an impurity, a silicide or the like, while the insulating layer 7 is made of, for example, silicon nitride.

Figure 1C:
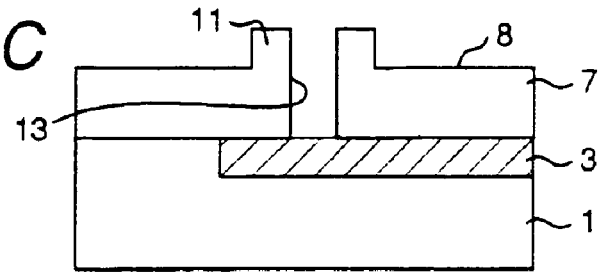

Next, as shown in FIG. 1C, a through hole 13 that reaches the wiring layer 3 is formed through the insulating layer 7, and a grounding wiring groove 8 is formed on the insulating layer 7 by the techniques of photolithography and dry etching. A portion of the insulating layer 7 that is left between the through hole 13 and the grounding wiring groove 8 becomes a through hole insulator 11 that forms a wall surface of the through hole 13.

Figure 1D:
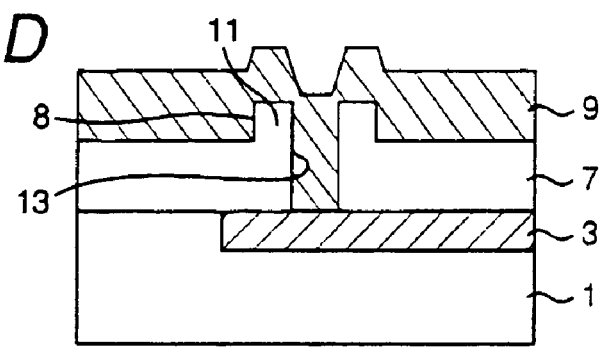

Next, as shown in FIG. 1D, a conductive layer 9 made of, for example, copper is formed on the insulating layer 7 so as to entirely cover the insulating layer 7 and fill up the through hole 13 and the grounding wiring groove 8.

Figure 1E:
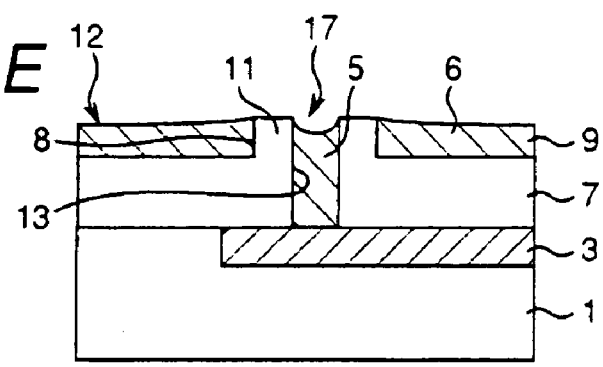
Figure 2A:
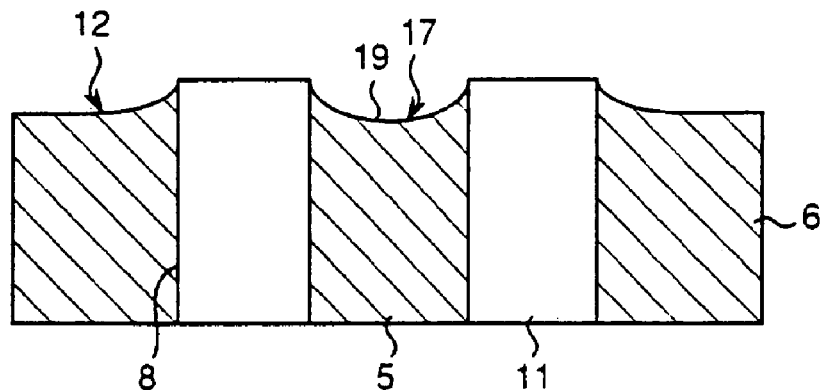
FIGS. 2A, 2B and 2C are views for explaining an etching process of the first embodiment.

Next, as shown in FIG. 1E, the conductive layer 9 is flattened by polishing according to the CMP method until the through hole insulator 11 is exposed. As described above, by performing polishing according to the CMP method until the through hole insulator 11 is exposed, the conductive layer 9 is separated into a through hole conductor 5 that is made of copper and fills up the through hole 13 and a grounding wiring layer 6 that buries the grounding wiring groove 8. The surfaces of the through hole conductor 5, the through hole insulator 11 and the grounding wiring layer 6 form a bonding surface 12 of an approximately same height. It is to be noted that the through hole conductor 5 and the grounding wiring layer 6, which are made of copper, have a hardness lower than that of the through hole insulator 11. Therefore, as shown in FIG. 1E and FIG. 2A, the surfaces of the through hole conductor 5 and the grounding wiring layer 6 become concave in a dish-like shape and lowered with respect to the surface of the through hole insulator 11 by the CMP. That is, a dishing portion 17 that is concave in a dish-like shape occurs on the surface of the through hole conductor 5.

Figure 2B:
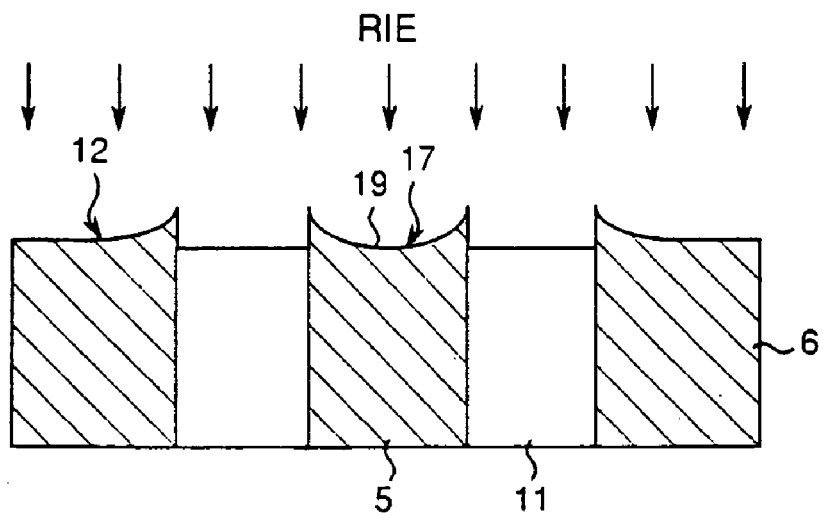
Figure 2C:
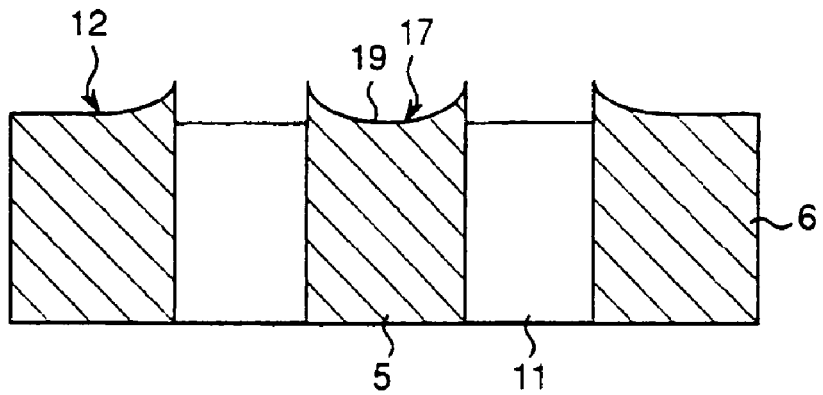

Next, as shown in FIGS. 2B and 2C, by the reactive ion etching (RIE) method, the through hole insulator 11 is selectively etched until the through hole insulator 11 comes to have a height equal to the height of the bottom portion 19 of the dishing portion 17 of the through hole conductor 5. This reactive ion etching has selectivity and anisotropy, and therefore, the through hole insulator 11 can be finely processed to make the through hole insulator 11 have a height approximately equal to the height of the bottom portion 19 of the dishing portion 17. On the whole, the height of the surface of the through hole insulator 11 is lowered with respect to the height of the surface of the through hole conductor 5. That is, the through hole conductor 5 is protruding from the surface of the through hole insulator 11.

Figure 3:
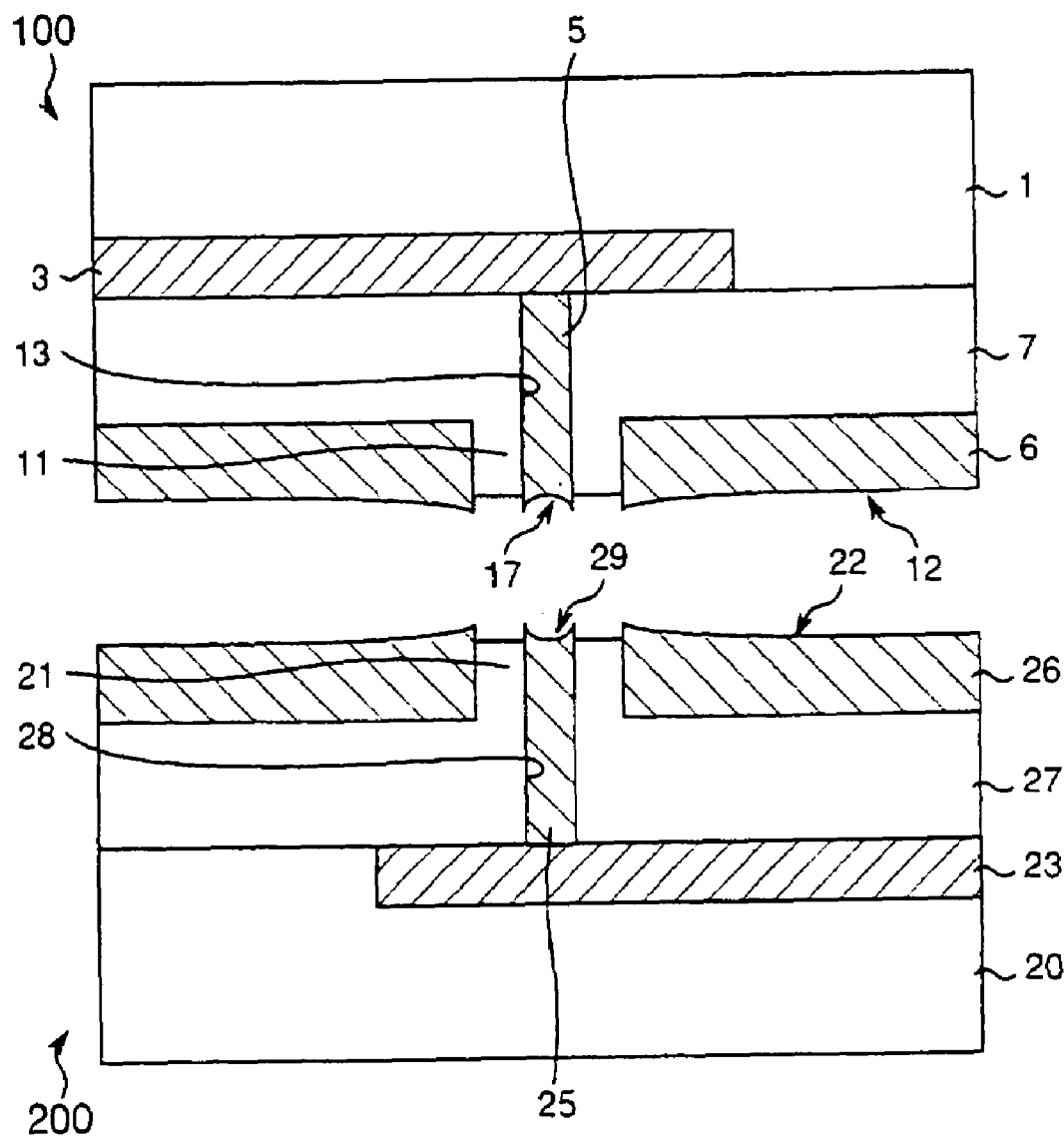
FIG. 3 is a view for explaining a state immediately before the execution of the solid state bonding of the first embodiment.

As shown in FIG. 3, a first portion 100 constructed of the semiconductor substrate 1, the wiring layer 3, the insulating layer 7, the through hole insulator 11, the through hole conductor 5 and the grounding wiring layer 6 is thus formed. Although not shown, semiconductor elements such as transistors, capacitors and so on are built in the first portion 100.

By performing quite the same processes as the fabricating processes of the first portion 100, a second portion 200 as shown in FIG. 3 is formed. This second portion 200 is constructed of a semiconductor substrate 20 that serves as a second substrate, a wiring layer 23 that serves as a conductive layer, an insulating layer 27, a grounding wiring layer 26 that serves as a conductive layer, a through hole insulator 21 and a through hole conductor 25. A bonding surface 22 of this second portion 200 is flattened by polishing according to the CMP method, and therefore, a dishing portion is formed on the through hole conductor 25 and the grounding wiring layer 26, which serve as conductive regions. However, the through hole insulator 21 is selectively etched by reactive ion etching so that the bottom portion of the dishing portion 29 of the through hole conductor 25 and the through hole insulator 21 come to have an approximately equal height. It is to be noted that a reference numeral 28 denotes a through hole.

Although not shown, semiconductor elements such as transistors, capacitors and so on are built in the second portion 200, similarly to the first portion.

Figure 4:
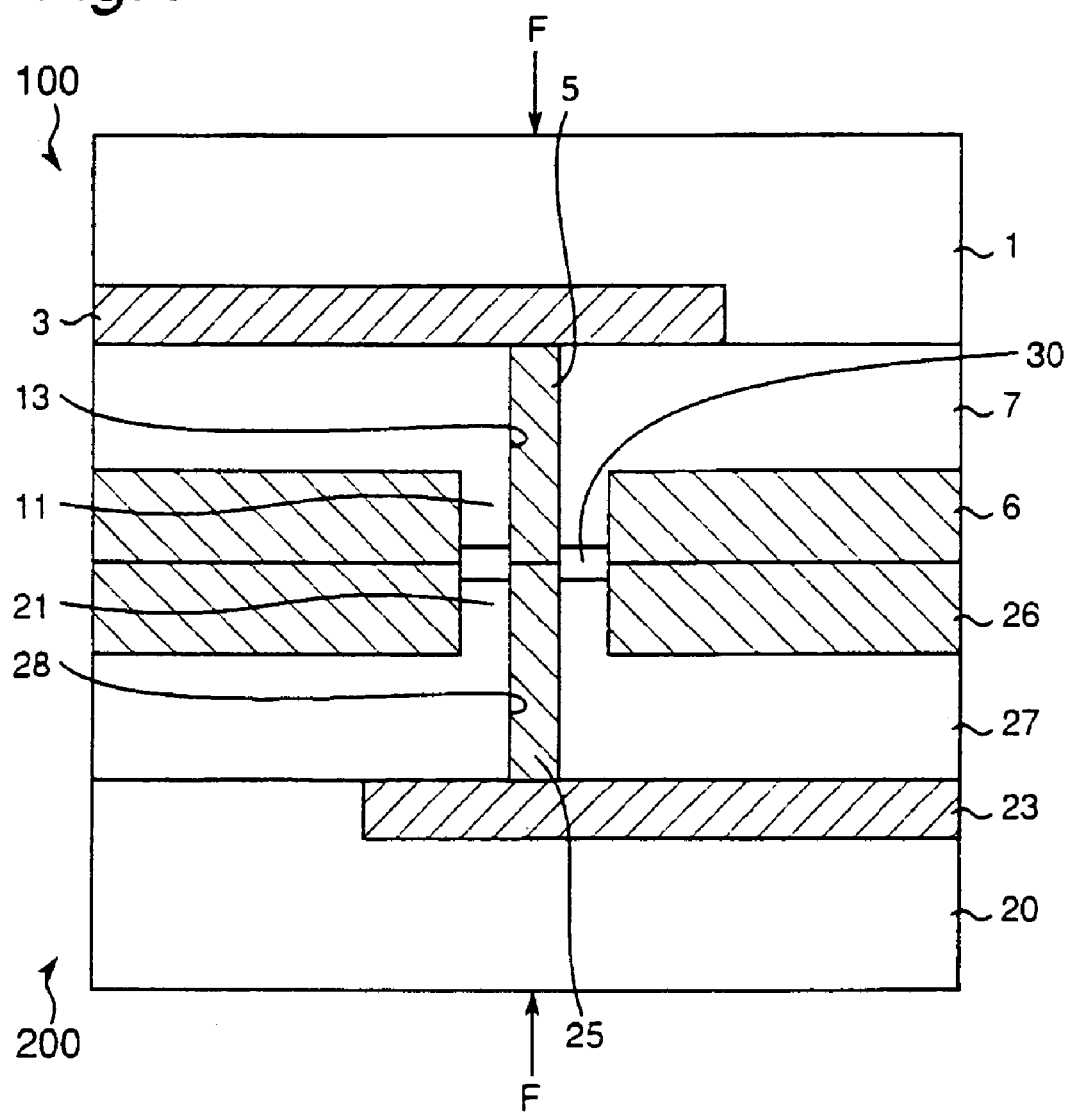
FIG. 4 is a sectional view of the semiconductor device of the first embodiment.

Next, the bonding surfaces 12 and 22 of the first portion 100 and the second portion 200 are subjected to a cleaning process in a vacuum to become clean surfaces. In other words, the bonding surfaces 12 and 22 are activated. Subsequently, in a vacuum or an inert gas atmosphere, the bonding surface 12 of the first portion 100 and the bonding surface 22 of the second portion 200 are made to face each other in a manner that the through hole conductors 5 and 25 are aligned with each other and the grounding wiring layers 6 and 26 are aligned with each other, respectively. Then, as shown in FIG. 4, by applying pressure welding loads F and F to the semiconductor substrate 1 of the first portion 100 and the semiconductor substrate 20 of the second portion 200, the through hole conductors 5 and 25 are solid-state-bonded or bonded at a room temperature (room temperature bonding) to each other, and the grounding wiring layers 6 and 26 are solid-state-bonded to each other. Then, the height of the bottom portions of the dishing portions 17 and 29 of the through hole conductors 5 and 25 becomes approximately equal to the height of the through hole insulators 11 and 21. As a whole, the through hole conductors 5 and 25 and the grounding wiring layers 6 and 26 are convex with respect to the surfaces of the through hole insulators 11 and 21. Therefore, the through hole conductor 5 and the grounding wiring layer 6 are securely solid-state-bonded to the through hole conductor 25 and the grounding wiring layer 26, respectively. With this arrangement, the electrical connection of the through hole conductors 5 and 25 and the electrical connection of the grounding wiring layers 6 and 26 can be improved in terms of reliability.

A clearance 30 occurs in a portion located between the through hole insulators 11 and 21 and around the through hole conductors 5 and 25 that have been solid-state-bonded (i.e., in a surface activated bonding manner). As described above, by providing the clearance 30 between the through hole insulators 11 and 21, the through hole conductors 5 and 25 and the grounding wiring layers 6 and 26 can be more securely solid-state-bonded to each other, respectively, enabling the achievement of more secure mechanical and electrical bonding. It is also acceptable to put the through hole insulators 11 and 21 in light contact or make them solid-state-bonded without providing the clearance 30. As described above, when the through hole insulators 11 and 21 are solid-state-bonded to each other, the bonding of the first portion 100 to the second portion 200 is made more firm.

In the aforementioned embodiment, the surfaces of the through hole insulators 11 and 21 are lowered with respect to the surfaces of the through hole conductors 5 and 25 on both the bonding surface 12 of the first portion 100 and the bonding surface 22 of the second portion 200. However, it is acceptable to perform etching so that the through hole insulator is much lowered with respect to the surface of the through hole conductor on one bonding surface and to make the entire surface of the dishing portion of the through hole conductor lower than the surface of the through hole insulator without performing the etching for adjusting the height of the through hole insulator on the other bonding surface. Even with this arrangement, by increasing the quantity of etching of one through hole insulator, the through hole conductors can be securely electrically connected to each other even through the dishing portions exist.

FIGS. 5A through 5E, 6A through 6C, 7 and 8 are views for explaining the semiconductor device fabricating method of the second embodiment. As clearly shown in FIGS. 7 and 8, a first portion 100 has the same construction as that of the first portion 100 of the first embodiment and is fabricated through the same processes. Therefore, no description is provided for the first portion 100, and the same reference numerals as those used in the first embodiment are used.

Figure 5A:
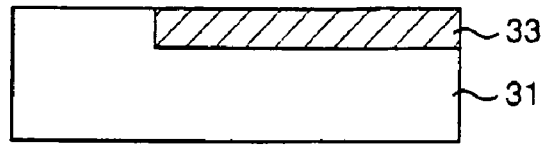
FIGS. 5A, 5B, 5C, 5D and 5E are views for explaining a semiconductor device fabricating method according to a second embodiment of the present invention.
Figure 5B:
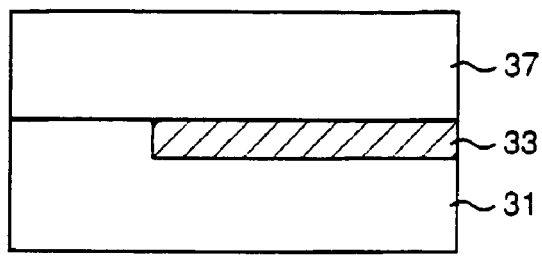

A second portion 300 is fabricated through the processes shown in FIGS. 5A through 5E and 6A through 6C. First, as shown in FIG. 5A, a wiring layer 33 is provided as an example of the conductive layer on a semiconductor substrate 31 that serves as an example of the second substrate. Further, as shown in FIG. 5B, an insulating layer 37 is laminated on the semiconductor substrate 31 and the wiring layer 33. The wiring layer 33 is made of a polysilicon doped with an impurity, copper, an aluminum alloy or the like, while the insulating layer 37 is made of, for example, silicon nitride, silicon oxide or the like.

Figure 5C:
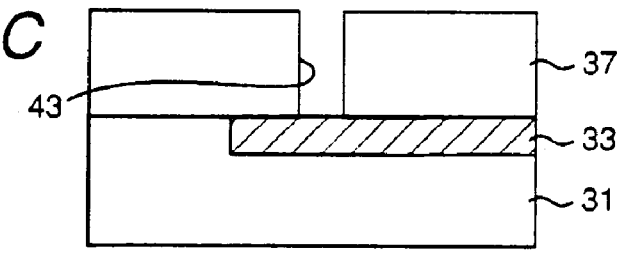

Next, as shown in FIG. 5C, a through hole 43 that reaches the wiring layer 33 is formed through the insulating layer 37 by the techniques of photolithography and dry etching.

Figure 5D:
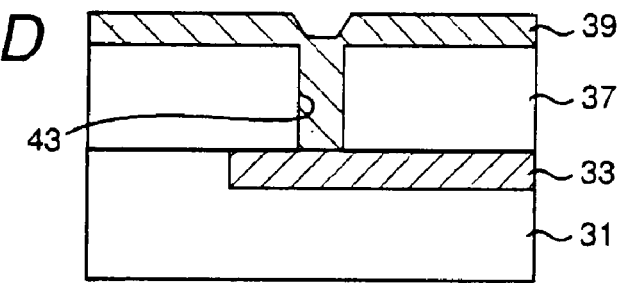

Next, as shown in FIG. 5D, a conductive layer 39 made of, for example, polysilicon is formed on the insulator 37 and the wiring layer 33 located at the bottom of the through hole 43 so as to fill up the through hole 43.

Figure 5E:
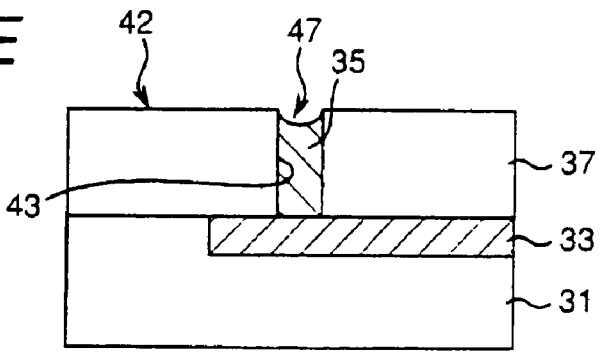
Figure 6A:
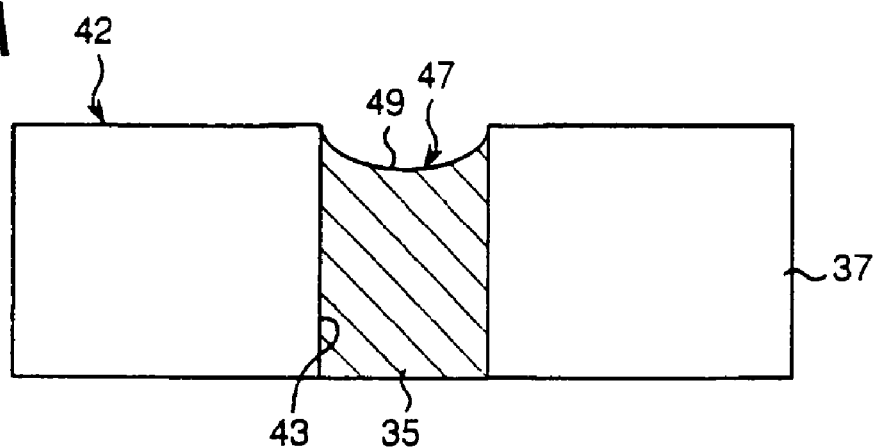
FIGS. 6A, 6B and 6C are views for explaining an etching process of the second embodiment.

Next, as shown in FIG. 5E, the conductive layer 39 and the insulating layer 37 are flattened by polishing according to the CMP method. By performing polishing according to the CMP method, the surfaces of the through hole conductor 35 positioned inside the through hole 43 and the insulating layer 37 form a bonding surface 42 having an approximately equal height. It is to be noted that the through hole conductor 35 made of polysilicon has a hardness lower than that of the insulating layer 37 made of silicon nitride. Therefore, as shown in FIG. 5E and FIG. 6A, the surface of the through hole conductor 35 becomes concave in a dish-like shape and lowered with respect to the surface of the insulating layer 37 by the CMP. That is, a dishing portion 47 that is concave in a dish-like shape occurs on the surface of the through hole conductor 35.

Figure 6B:
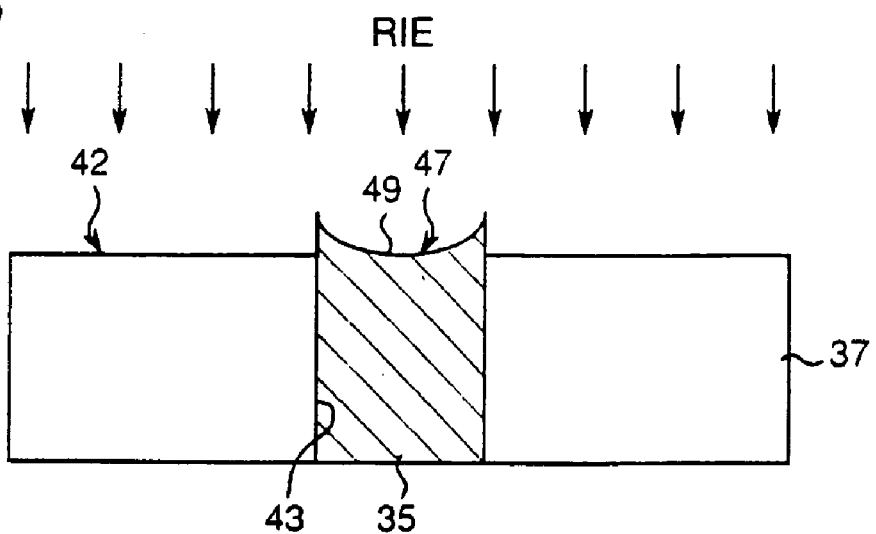
Figure 6C:
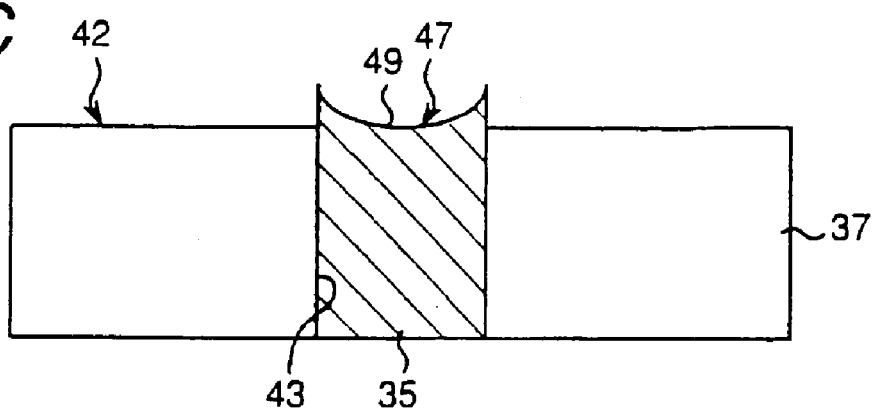

Next, as shown in FIGS. 6B and 6C, by the reactive ion etching method, the insulating layer 37 is selectively etched until the insulating layer 37 comes to have a height equal to the height of the bottom portion 49 of the dishing portion 47 of the through hole conductor 35. On the whole, the height of the surface of the insulating layer 37 is lowered with respect to the height of the surface of the through hole conductor 35. That is, the through hole conductor 35 is protruding from the surface of the insulating layer 37.

As shown in FIG. 7, the second portion 300 constructed of the semiconductor substrate 31, the wiring layer 33, the insulating layer 37 and the through hole conductor 35 is thus formed.

Figure 8:
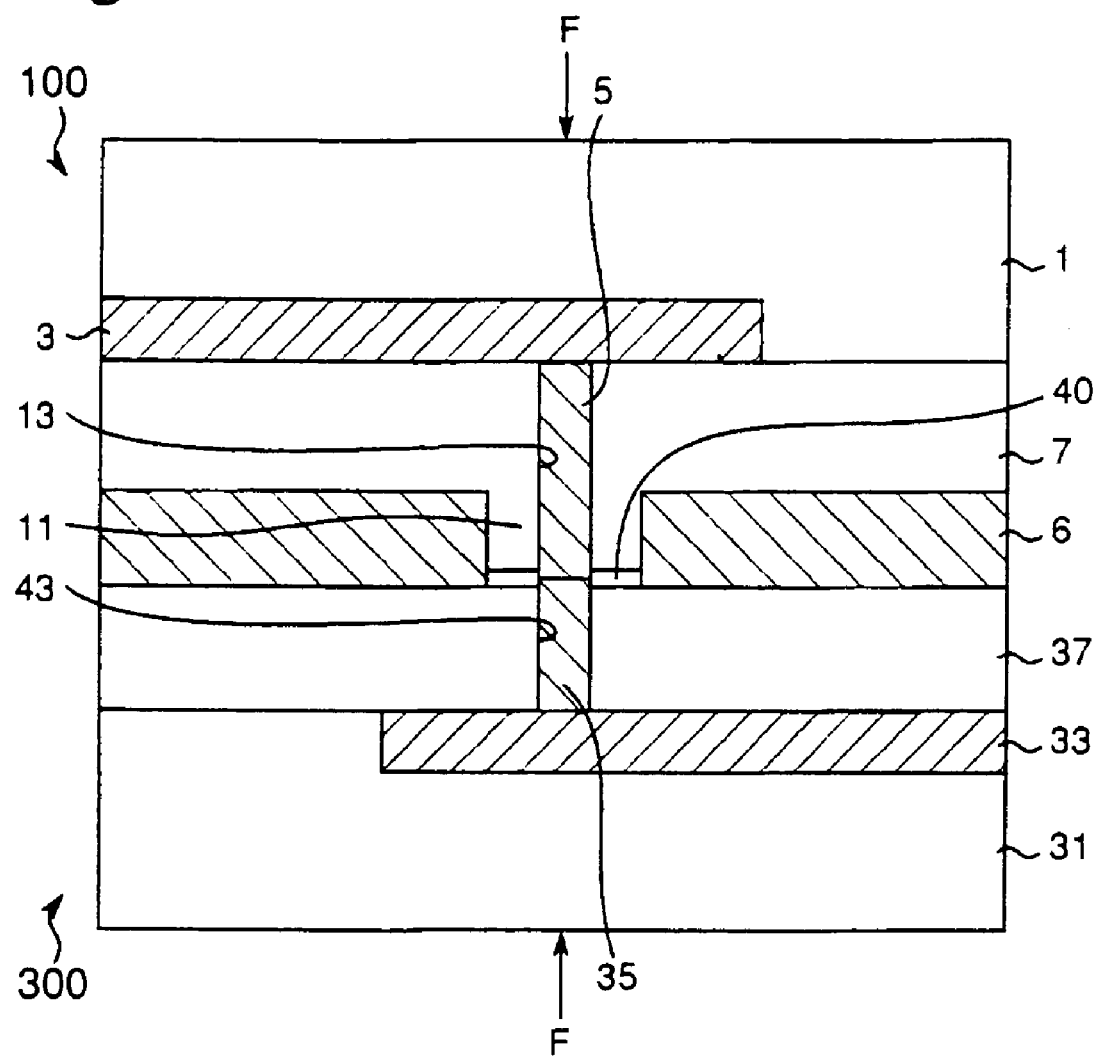
FIG. 8 is a sectional view of the semiconductor device of the second embodiment.

Next, the bonding surfaces 12 and 42 of the first portion 100 and the second portion 300 are subjected to a cleaning process in a vacuum to become clean surfaces. In other words, the bonding surfaces 12 and 42 are activated. Subsequently, in a vacuum or an inert gas atmosphere, the bonding surface 12 of the first portion 100 and the bonding surface 42 of the second portion 300 are made to face each other in a manner that the through hole conductors 5 and 35 are aligned with each other. Then, as shown in FIG. 8, by applying pressure forces, i.e., pressure welding loads F and F to the semiconductor substrate 1 of the first portion 100 and the semiconductor substrate 31 of the second portion 300, the through hole conductors 5 and 35 are solid-state-bonded to each other, and the grounding wiring layer 6 and the insulating layer 37 are solid-state-bonded to each other. Then, the height of the bottom portion of the dishing portion 17 of the through hole conductor 5 becomes approximately equal to the height of the through hole insulator 11. The through hole conductor 5 and the grounding wiring layer 6 are totally convex with respect to the through hole insulator 11. In addition, the height of the bottom portion of the dishing portion 47 of the through hole conductor 35 is approximately equal to the height of the insulating layer 37, and the through hole conductor 35 is convex with respect to the insulating layer 37. Therefore, the through hole conductor 5 and the through hole conductor 35 are securely solid-state-bonded to each other, while the grounding wiring layer 6 and the insulating layer 37 are securely solid-state-bonded to each other. With this arrangement, the mechanical connection and electrical connection of the through hole conductors 5 and 35 as well as the mechanical connection of the grounding wiring layer 6 and the insulating layer 37 can be improved in terms of reliability.

A clearance 40 occurs between the through hole insulator 11 and the insulating layer 37 and around the through hole conductors 5 and 35 that have been solid-state-bonded. As described above, by providing the clearance 40 between the through hole insulator 11 and the insulating layer 37, the solid state bonding of the through hole conductor 5 to the through hole conductor 35 and the solid state bonding of the grounding wiring layer 6 to the insulating layer 37 can be further secured for the achievement of more secure mechanical and electrical bonding. It is also acceptable to put the through hole insulator 11 and the insulating layer 37 in light contact or make them solid-state-bonded without providing, the clearance 40. As described above, when the through hole insulator 11 and the insulating layer 37 are solid-state-bonded to each other, the bonding of the first portion 100 to the second portion 300 is made more firm.

In the aforementioned first or second embodiment, the insulating regions (through hole insulators and insulating layer) 11, 21 and 37 surround the conductive regions (through hole conductors) 5, 25 and 35 on the bonding surfaces 12, 22 and 42. However, the insulating regions are not required to surround the respective conductive regions, and it is only required to provide the conductive regions and the insulating regions. It is also acceptable that one bonding surface has the conductive region and the insulating region while the other bonding surface has only the conductive region. According to the present invention, the insulating region is etched so that the dishing portion in the conductive region protrudes above the insulating region on the bonding surface polished by the CMP method. Therefore, the present invention can be applicable if at least one bonding surface has the conductive region and the insulating region.

According to the first or second embodiment, the through hole conductor 5 is solid-state-bonded to the through hole conductor 25 or 35, and the grounding wiring layer 6 is solid-state-bonded to the grounding wiring layer 26 or the insulating layer 37. However, the present invention is, of course, not limited to this. For example, it is acceptable to solid-state-bond an insulating layer to an insulating layer or solid-state-bond a plurality of wiring layers and through hole conductors to a power supply layer that serves as a conductive layer. It is also acceptable to solid-state-bond a plurality of wiring layers to one another.

Although the conductive layer is made of copper or polysilicon in the aforementioned embodiments, the conductive layer may be formed of, for example, silicide, an aluminum alloy or the like, while the insulating layer may be formed of silicon oxide besides the silicon nitride.

Although the semiconductor substrate is employed as a substrate in the aforementioned embodiments, it is acceptable to employ an inorganic substrate such as a glass substrate and a ceramic substrate or an organic substrate made of an organic compound.

Although the aforementioned embodiments uses reactive ion etching as etching, it is acceptable to use other dry etching such as reactive sputtering etching, plasma etching, ion beam etching and photoetching or wet etching.

As is apparent from the above, according to the semiconductor device of the present invention, the insulating region is lowered with respect to the conductive region on at least one of the two bonding surfaces that are to be polished by the CMP method and then solid-state-bonded. Therefore, the conductive regions can be securely subjected to solid state bonding and securely electrically connected to each other.

Furthermore, according to the semiconductor device fabricating method of the present invention, the insulating region is selectively etched so that the surface of the insulating region is lowered with respect to the surface of the conductive region on at least one of the two bonding surfaces that have been polished by the CMP method. Therefore, the conductive regions can be securely subjected to solid state bonding and securely electrically connected to each other even though a dishing portion exists on the conductive region.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device fabricating method comprising the steps of:

forming a first portion having a first substrate, a conductive layer and an insulating layer laminated on the first substrate and a bonding surface that is chemically mechanically polished and exposes a conductive region and an insulating region;

forming a second portion having a second substrate, a conductive layer and an insulating layer laminated on the second substrate and a bonding surface that is chemically mechanically polished and exposes at least a conductive region;

selectively etching the insulating region of at least one of the bonding surface of the first portion and the bonding surface of the second portion, thereby lowering the surface of the insulating region with respect to the surface of the conductive region; and applying pressure welding loads to the first portion and the second portion for achievement of solid state bonding of the bonding surface of the first portion to the bonding surface of the second portion and for achievement of electrical connection of the conductive region of the first portion with the conductive region of the second portion.

2. A semiconductor device fabricating method as claimed in claim 1, wherein the surface of the insulating region is lowered by reactive ion etching.

3. A semiconductor device fabricating method as claimed in claim 1, wherein etching is performed so that a height of a bottom of a dishing portion of the conductive region and a height of the insulating region become approximately equal to each other.

4. A semiconductor device fabricating method as claimed in claim 1, wherein the conductive region of the first portion and the conductive region of the second portion are solid-state-bonded to each other, and the insulating region of the first portion and the insulating region of the second portion face each other with interposition of a clearance.

5. A semiconductor device fabricating method as claimed in claim 4, wherein the insulating region that surrounds the conductive region of the first portion and the insulating region that surrounds the conductive region of the second portion face each other with interposition of a clearance.

6. A semiconductor device fabricating method as claimed in claim 1, wherein the conductive region of the first portion and the conductive region of the second portion are solid-state-bonded to each other, and the insulating region of the first portion and the insulating region of the second portion are put in contact with or solid-state-bonded to each other.

7. A semiconductor device fabricating method as claimed in claim 6, wherein the insulating region that surrounds the conductive region of the first portion and the insulating region that surrounds the conductive region of the second portion are put in contact with or solid-state-bonded to each other.

8. A semiconductor device fabricating method as claimed in claim 5, wherein the conductive regions are end surfaces of through hole conductors and the insulating regions are end surfaces of through hole insulators that surround the respective through hole conductors.

9. A semiconductor device fabricating method as claimed in claim 7, wherein the conductive regions are end surfaces of through hole conductors and the insulating regions are end surfaces of through hole insulators that surround the respective through hole conductors.

10. A semiconductor device fabricating method as claimed in claim 1, wherein the first substrate or the second substrate is any one of a semiconductor substrate, an inorganic substrate and an organic substrate.

11. A method of making a semiconductor device, the method comprising:
providing a first portion comprising a first substrate, a conductive layer and an insulating layer laminated on the first substrate and a bonding surface that is chemically mechanically polished and exposes a conductive region and an insulating region, wherein the conductive region includes a concave surface defining a dishing portion;
providing a second portion comprising a second substrate, a conductive layer and an insulating layer laminated on the second substrate and a bonding surface that is chemically mechanically polished and exposes at least a conductive region having a concave surface defining a dishing portion;
bonding the bonding surface of the first portion and the bonding surface of the second portion to each other so that the dishing portions of the conductive regions of the respective first and second portions are bonded to each other so as to directly contact one another, and
wherein at least one of the bonding surface of the first portion and the bonding surface of the second portion has the insulating region lowered with respect to the conductive region.

12. The method of claim 11, wherein the conductive region of the first portion and the conductive region of the second portion are solid-state-bonded to each other, and the insulating region of the first portion and the insulating region of the second portion face each other with interposition of a clearance.

13. The method of claim 12, wherein the insulating region that surrounds the conductive region of the first portion and the insulating region that surrounds the conductive region of the second portion face each other with interposition of a clearance.

14. The method of claim 11, wherein the conductive region of the first portion and the conductive region of the second portion are solid-state-bonded to each other, and the insulating region of the first portion and the insulating region of the second portion are put in contact with or solid-state-bonded to each other.

15. The method of claim 14, wherein the insulating region that surrounds the conductive region of the first portion and the insulating region that surrounds the conductive region of the second portion are put in contact with or solid-state-bonded to each other.

16. The method of claim 13, wherein the conductive regions are end surfaces of through hole conductors and the insulating regions are end surfaces of through hole insulators that surround the respective through hole conductors.

17. The method of claim 15, wherein the conductive regions are end surfaces of through hole conductors and the insulating regions are end surfaces of through hole insulators that surround the respective through hole conductors.

18. The method of claim 11, wherein the first substrate or the second substrate is any one of a semiconductor substrate, an inorganic substrate and an organic substrate.

* * * * *